United States Patent
Dunn

(10) Patent No.: US 6,606,793 B1
(45) Date of Patent: Aug. 19, 2003

(54) PRINTED CIRCUIT BOARD COMPRISING EMBEDDED CAPACITOR AND METHOD OF SAME

(75) Inventor: Gregory J. Dunn, Arlington Heights, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/628,486

(22) Filed: Jul. 31, 2000

(51) Int. Cl.⁷ .................................................. H01K 3/10
(52) U.S. Cl. ............................ 29/853; 29/847; 174/260
(58) Field of Search ................. 174/260; 361/761–766; 29/846–853

(56) References Cited

U.S. PATENT DOCUMENTS

| | | | | |
|---|---|---|---|---|
| 5,920,454 A | * | 7/1999 | Nomura et al. .............. | 361/313 |
| 6,021,563 A | * | 2/2000 | Heo et al. .................... | 257/669 |
| 6,025,057 A | * | 2/2000 | Angelopoulos et al. ..... | 174/258 |
| 6,115,233 A | * | 9/2000 | Seliskar et al. .............. | 257/296 |
| 2002/0043399 A1 | | 4/2002 | Sasaki et al. | |

* cited by examiner

Primary Examiner—David L. Talbott
Assistant Examiner—Jeremy Norris
(74) Attorney, Agent, or Firm—Daniel K. Nichols

(57) ABSTRACT

A method for forming an embedded low profile capacitor in a multilayer printed circuit board. The method entails providing a first metal plate on a dielectric substrate. A dielectric layer of a photopolymeric material is applied onto a first region of the first metal plate, surrounded by a second region that is exposed. A second metal plate is deposited onto the dielectric layer and the second region of the first metal plate. The second plate is then patterned to decline an upper electrode on the dielectric layer that is electrically isolated from the first metal plate. This may be accomplished by forming a trench in the second metal plate above the dielectric layer. In one aspect, the resulting capacitor thus comprises a lower electrode structure derived mainly from the first metal plate, a dielectric layer overlying the first region of the first metal plate and an upper electrode overlying the dielectric layer. The lower metal structure also includes an extension deposited onto the second region of the first metal layer about the dielectric layer and including a lip overlying a perimeter of the dielectric layer surface.

4 Claims, 1 Drawing Sheet

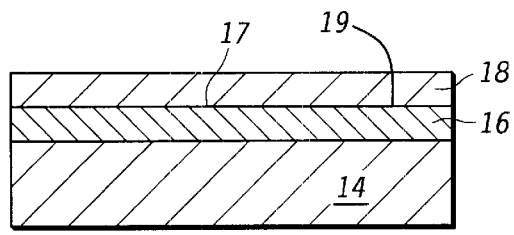
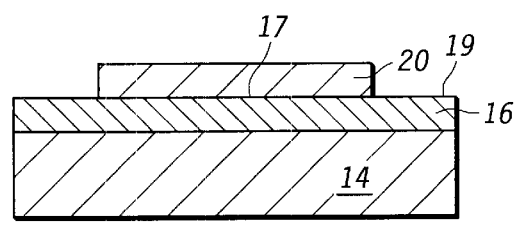
*FIG.1*  *FIG.2*
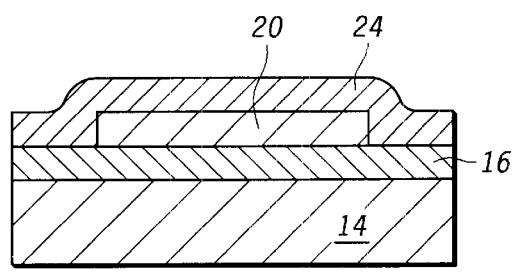
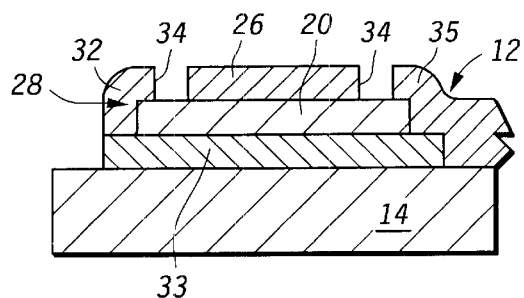
*FIG.3*  *FIG.4*
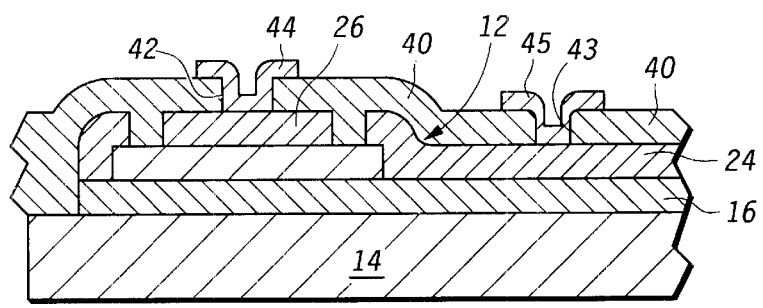
*FIG.5*

PRINTED CIRCUIT BOARD COMPRISING EMBEDDED CAPACITOR AND METHOD OF SAME

This invention was made with Government support under Agreement No. F33615-96-2-1838 awarded by DARPA. The Government has certain rights in the invention.

BACKGROUND OF THE INVENTION

The present invention generally relates to a printed circuit board having an embedded capacitor comprising a dielectric layer formed of a polymeric material or the like and having a substantially uniform thickness, and to its method of fabrication.

The trend in printed circuit board manufacture is towards further miniaturization and the incorporation of formerly stand alone passive components, for example, capacitors and resistors, in built-up layers thereon. Replacement with integrated components is particularly advantageous because it reduces the cost associated with placement of discrete components on the board and also because it makes available valuable area on the board surface for additional circuitry and other electrical components.

It has been proposed to form an embedded capacitor in the built-up layers by patterning a lower metal electrode, coating the lower electrode with a polymeric layer and then forming a second metal electrode on the polymeric layer. At the perimeter of the lower electrode, there is a tendency for the polymeric coating to become thinner than in planar regions. This thinning can result in exposed edges that create shorts between the electrodes.

There has also been difficulty obtaining embedded capacitors with precise capacitances using standard coating techniques. To control capacitance, it is necessary to control both the thickness and uniformity of the dielectric layer. A patterned dielectric layer tends to planarize fairly well over narrow, small, patterned metal features. However, when the underlying metal feature is large, the dielectric layer is not reliably level and may be substantially thicker, reducing capacitance and making it difficult to achieve the desired capacitance value with precision.

Thus, there is a need for a capacitor adapted for fabrication within a multilayer board and having a dielectric layer formed of a polymeric material and having a substantially uniform thickness. In a preferred case, it is desired to manufacture such capacitors at relatively low cost using existing printed circuit board manufacturing equipment and know how.

SUMMARY OF THE INVENTION

According to the present invention, a method is provided for forming a capacitor as an integral element of a printed circuit board. The method entails providing a first metal plate on a dielectric substrate. A dielectric layer, preferably formed of a photopolymeric material, is then applied onto a first region of the first metal plate. The first metal plate also includes a second region that is exposed about the dielectric layer. Thereafter, a second metal plate is deposited onto the dielectric layer and the second region of the first metal plate. The second metal plate is patterned to form an upper electrode overlying the dielectric layer and electrically isolated from the first metal plate. In a preferred embodiment, this is accomplished by forming a trench in the second plate about the upper electrode. Thus, the resulting capacitor comprises a lower electrode structure featuring a metal plate applied to a substrate, a dielectric layer overlying the first region of the metal plate, and an upper electrode overlying the dielectric layer. Moreover, in the preferred embodiment, the lower electrode structure comprises an extension derived from the second metal plate and disposed about the dielectric layer. The extension includes a lip overlying a perimeter surface of the dielectric layer spaced apart from the upper electrode by the trench. In still another aspect of this invention, a polymeric coating is applied over the capacitor, whereby the capacitor becomes embedded therein, and metallized connections are formed through vias in the polymeric coating to the upper electrode and the lower electrode structure for electrically coupling the capacitor, for example, to electrical features subsequently formed on the surface.

From the above, those skilled in the art will appreciate that the method described above is conducive to inline printed circuit board processing, thus enabling high throughput and short cycle time. More significantly, since the dielectric layer is formed on the metal plate prior to the patterning step that defines the lower electrode structure, the method is particularly adapted for forming a dielectric layer having a uniform thickness and thereby achieving capacitors having consistent and predetermined capacitance values.

BRIEF DESCRIPTION OF THE DRAWINGS

FIGS. 1 through 4 represent processing steps for forming a printed circuit board comprising a capacitor in accordance with a preferred embodiment of this invention.

FIG. 5 shows the printed circuit board in accordance with FIGS. 1–4 following further processing to embed the capacitor in a dielectric coating and form a metal connections to the board surface.

DETAILED DESCRIPTION OF THE PREFERRED EMBODIMENT

Referring to FIGS. 1 through 5, there are depicted processing steps for producing printed circuit board 10 in FIG. 5 having an embedded, low profile capacitor 12 in accordance with a preferred embodiment of this invention. Referring to FIG. 1, the circuit board comprises dielectric substrate 14. By way of a preferred example, substrate 14 is composed of a glass fiber-epoxy resin composite as is commonly employed in the electronics industry. Alternately, substrate 14 may be formed of any suitable base having a surface composed of polymeric, ceramic or other dielectric material. Suitable substrates include rigid or flexible polymeric films or ceramic or silicon substrates. In another aspect of this invention, capacitor 12 may be formed on a surface dielectric layer of a multilayer circuit board having embedded electrical features adapted for a desired application.

Referring to FIG. 1, a first metal plate 16 is applied to the surface of substrate 14. Plate 16 is preferably formed of copper having a thickness between about 5 to 15 microns and laminated onto substrate 14. Although laminated copper is commonly employed in forming printed circuit boards, plate 16 may be formed of any suitable metal such as gold, silver, nickel or alloys thereof and may be applied by plating or other suitable process. Plate 16 comprises a first region 17 that constitutes a desired site for a dielectric layer for the capacitor and a second, remaining region 19 about the first region.

With further reference to FIG. 1, a polymeric film or layer 18 is applied to plate 16 and patterned to form dielectric layer 20 in FIG. 2. In accordance with the preferred embodiment, film 18 is composed of a negative-acting photopolymeric material that is characterized by a soluble state when applied and that develops an insoluble state when exposed to actinic radiation and thermally cured. Suitable materials include liquid epoxy-based compositions commercially available from Ciba-Geigy Inc. under the Probelec trade designation or epoxy dry films available from DuPont under the Vialux trade designation. Epoxy resins are particularly suited for use with epoxy substrates in the preferred embodiment. The photopolymeric material generally contains a prepolymer and a photosensitive agent effective in response to actinic radiation to initiate polymerization of the prepolymer. In addition, the material may contain hardeners and other additives for enhancing mechanical and electrical properties of the product resin. In particular, ceramic fillers may be added to enhance the permativity and thereby increase capacitance density of the product capacitor. To form the dielectric layer for the capacitor, film 18 is applied having a substantially uniform thickness. A portion of layer 18 overlying region 17 is selectively exposed to actinic radiation effective to initiate curing or the photopolymeric material, using a mask to avoid exposure of the surrounding material overlying region 19. Thereafter, the layer is heated at a temperature effective to partially cure the photopolymeric material to form an insoluble state in the irradiated material overlying region 17, while maintaining the solubility of the material on region 19. The board is then washed with a solvent to remove unwanted photopolymeric material, thereby exposing the metal plate at the region 19. The remaining, insoluble photopolymeric material is then heated to finally cure the material and thereby form dielectric layer 20 for the capacitor.

The capacitance of the product capacitor is determined by composition and thickness of layer 20. In general, for a particular material, thinner layers exhibit higher capacitance. For epoxy materials in the preferred embodiment, layers 20 having thicknesses between about 5 to 50 microns exhibit capacitance densities of about 0.1 to 5.0 $nF/cm^2$.

While in this preferred embodiment, dielectric layer is formed from a negative acting photopolymerizable material, it may be suitable formed of positive acting photopolymeric material, or of thermoplastic or thermoset resin materials that are not photosensitive. According to this invention, dielectric layer 20 becomes a permanent dielectric plate of capacitor 12. Accordingly, a material is desired that forms a stable product resin stable throughout subsequent processing and useful life of the board. Epoxy materials for layer 20 are particularly well suited for us on glass fiber-filled epoxy printed circuit boards since they have similar physical properties and are very stable under environmental stresses such as rapidly changing temperatures and physical shock.

Referring to FIG. 3, following formation of dielectric layer 20, a second metal plate 24 is deposited onto region 19 of metal plate 16 and over dielectric layer 20. In this manner, dielectric layer 20 is encapsulated or enclosed in the metal plates. In a preferred embodiment, plate 24 is formed of copper, as is plate 16. A thin copper film is initially deposited by electroless copper deposition in order to provide a current carrier for subsequent electroplating onto dielectric layer 20. For this purpose, the surface is treated to deposit a catalyst, whereafter the catalyzed surface is plated using an electroless copper plating solution as is well known in the art. Thereafter, these surfaces are electroplated to produce metal layer 24. A significant advantage of the preferred embodiment is that the surface of dielectric layer 20 and the surface of region 17 are plated simultaneously such that the maximum step height is the thickness of dielectric layer 20. This facilitates subsequent coating of the capacitor to embed it within a polymeric layer.

With reference to FIG. 4, following deposition of layer 24, the layer is selectively etched using a sacrificial photoresist mask and treatment with a etching solution to define a first, upper electrode 26 and a lower electrode structure 28 of capacitor 12. The upper electrode 26 is separated from electrode structure 28 by a trench 34 formed in the second metal plate 24. Lower electrode structure 28 comprises an extension 32 derived from the second metal plate and a lower electrode plate 33 derived from the first metal plate 16. Extension 32 surrounds dielectric layer 20 and includes a lip 35 overlying the upper surface perimeter of the dielectric layer. For electrodes formed by copper and etched using a photoresist mask, the width of trench is determined by resolution capability in developing the photoresist mask and wet etching the copper. Typically the width of the trench in copper is greater than 75 microns. This is substantially larger than the thickness of the dielectric layer, so that the contribution to the capacitance across the trench is negligible in comparison to the capacitance across the dielectric layer. Thus, the capacitance of the capacitor is predominantly determined by the capacitance between upper electrode 28 and lower electrode plate 33 across the dielectric layer. Nevertheless, it is pointed out that the contribution across the trench adds to the capacitance and thus enhances performance of the capacitor.

In a preferred embodiment, it is desired to embed capacitor 12 within a polymeric layer that provides a planar surface for routing additional circuit features or attaching electrical components. For this purpose, substrate 14 with capacitor 12 is coated with a polymeric layer 40 shown in FIG. 5. In a preferred embodiment, layer 40 is composed of a polymer similar to the polymeric material used to form dielectric layer 20. After its application, it is photoimaged and developed to define a via 42 to upper electrode 26 and a via 43 to electrode structure 28. Alternately, coating 40 may be formed of a non-photosensitive polymer material and vias 42 and 43 defined by laser drilling or other suitable techniques known in the art. Finally, metal is plated into via 42 to form a metal connection 44 to upper electrode 26 and concurrently into via 43 to form connection 45 to lower electrode structure 28.

While the invention has been described in terms of preferred embodiments, other forms could be adapted by one skilled in the art. Accordingly, the invention is to be limited only in accordance with the following claims.

I claim:

1. A method of forming a capacitor on a printed circuit board, the method comprising the steps of:

providing a first metal plate on a dielectric substrate, said first metal plate having a first region and a second region about the first region, applying a photopolymeric film of a photosensitive polymer over said first metal plate, said photopolymeric film having a substantially uniform thickness, patterning the photopolymeric film to define a dielectric layer overlying the first region of the first metal plate and to expose the second region of the first metal plate by selectively irradiating a first portion of said photopolymeric film overlying the first region of the first metal plate while avoiding irradiation of a remaining portion, said first portion being irradiated by actinic radiation effective to initiate polymerization of the photosensitive polymer, said portion being sized and shaped corresponding to the dielectric layer, heating the photopolymeric layer to partially cure the first portion, removing the remaining portion to expose the first metal plate about the partially cured, first portion, and further heating the partially cured first portion to further cure the photosensitive polymeric material, plating a second metal plate onto the dielectric layer and the second region of the first metal plate such that the dielectric layer is enclosed within the first metal plate and the second metal plate, patterning said second metal plate to form an upper electrode overlying the dielectric layer and electrically isolated from the first metal plate and to concurrently pattern the second metal plate to form a lower electrode underlying the dielectric layer and cooperating with the upper electrode and the dielectric layer to form a capacitor, applying a polymeric coating overlying the capacitor, defining a via in said polymeric coating communicating with said upper electrode, and depositing metal into the via to form an electrical connection to the upper electrode.

2. The method of claim 1 where the dielectric layer is between about 5 and 50 microns thick.

3. The method of claim 1 wherein photopolymeric material is an epoxy based resin.

4. A method of claim 1 wherein the first metal plate and the second metal plate are formed of copper.

* * * * *